US008878334B1

(12) United States Patent
Ratnakumar et al.

(10) Patent No.: US 8,878,334 B1
(45) Date of Patent: Nov. 4, 2014

(54) INTEGRATED CIRCUIT RESISTORS WITH REDUCED PARASITIC CAPACITANCE

(75) Inventors: Albert Ratnakumar, San Jose, CA (US); Peter Smeys, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/429,284

(22) Filed: Mar. 23, 2012

(51) Int. Cl.
*H01L 29/00* (2006.01)
*H01L 21/336* (2006.01)
*H01L 27/07* (2006.01)
*H01L 49/02* (2006.01)

(52) U.S. Cl.
CPC ............ *H01L 27/0738* (2013.01); *H01L 28/20* (2013.01)
USPC .......................................... 257/528; 438/294

(58) Field of Classification Search
CPC . H01L 27/0738; H01L 27/0802; H01L 28/20; H01L 29/8605; H01L 27/075
USPC ......... 257/154, 350, 357–364, 379–380, 528, 257/536–538, 581–582, E27.016–E27.047, 257/E27.071, E27.101; 438/171, 190, 210, 438/238, 329, 330–332, 381–384
See application file for complete search history.

(56) References Cited

U.S. PATENT DOCUMENTS

| 4,903,093 | A | * | 2/1990 | Ide et al. ........................ 257/363 |
| 5,548,134 | A | | 8/1996 | Tailliet |
| 5,796,292 | A | * | 8/1998 | Aiello ............................ 327/534 |
| 5,831,317 | A | * | 11/1998 | Shimazaki ..................... 257/401 |
| 6,441,442 | B1 | | 8/2002 | Wong |
| 7,408,754 | B1 | | 8/2008 | O et al. |
| 7,477,495 | B2 | | 1/2009 | Dornbusch |
| 7,804,669 | B2 | | 9/2010 | Worley |
| 2001/0040270 | A1 | * | 11/2001 | Kobayashi ..................... 257/531 |
| 2010/0035421 | A1 | | 2/2010 | Denison et al. |
| 2013/0032862 | A1 | * | 2/2013 | Su et al. ........................ 257/272 |

* cited by examiner

*Primary Examiner* — Jae Lee
*Assistant Examiner* — Junaiden Mirsalahuddin
(74) *Attorney, Agent, or Firm* — Treyz Law Group; Jason Tsai

(57) ABSTRACT

Integrated circuits that include resistors are provided. An integrated circuit resistor may include a conductive structure disposed over a semiconductor substrate. An oxide layer may be interposed between the conductive structure and a top surface of the semiconductor substrate. A shallow trench isolation structure may be formed in the substrate directly beneath the oxide layer. The shallow trench isolation structure may be formed in a given region in the substrate that is contained within a surrounding n-well and a deep n-well. The given region within which the shallow trench isolation structure is formed may exhibit native substrate dopant concentration levels; the given region is neither an n-well nor a p-well. The surrounding n-well and the deep n-well may be reversed biased to help fully deplete the given region so that parasitic capacitance levels associated with the resistor are minimized.

16 Claims, 7 Drawing Sheets

INTEGRATED CIRCUIT RESISTORS WITH REDUCED PARASITIC CAPACITANCE

BACKGROUND

This relates to resistor circuitry, and more particularly, to resistor circuitry suitable for use in high speed analog circuit designs.

Analog circuits on an integrated circuit device typically include amplifiers that are used for amplifying alternating current (AC) signals (also referred to as "small" signals). These amplifiers often contain input transistors that are connected to associated loading resistors (i.e., output load resistors). The amplifiers provide a small signal gain that is proportional to the value of the associated loading resistors.

For example, consider a scenario in which a first amplifier contains a first input transistor and a first load resistor connected in series and in which a second amplifier contains a second input transistor and a second load resistor connected in series. The first load resistor may exhibit a first resistance value, whereas the second load resistor may exhibit a second resistance value that is greater than the first resistance value. Assuming that the first and second input transistors have identical transistor characteristics (i.e., same channel type and transistor dimensions) and that the current flowing through the first input transistor is equal to the current flowing through the second input transistor, the second amplifier will exhibit a gain that is greater than that of the first amplifier because the second resistance value is greater than the first resistance value.

An amplifier load resistor is typically connected to the output of an amplifier. Conventional load resistors may exhibit parasitic capacitance that can hinder the performance of the amplifier. If the parasitic capacitance associated with the load resistor is unacceptably large, the rate at which the small signals oscillate at the output of the amplifier may be severely reduced. In order to compensate for this reduction in speed, a greater amount of current may be required to flow through the input transistors. In other words, higher parasitic capacitance undesirably results in reduced performance and/or increased power consumption.

A first type of conventional load resistor includes a polysilicon structure disposed over a shallow trench isolation (STI) structure that is formed in a semiconductor substrate. A gate oxide is interposed between the polysilicon structure and the surface of the substrate where the STI structure is formed. An n-well is formed below the STI structure. A deep n-well is formed below the n-well. The deep n-well is actively driven to a fixed biased voltage. A depletion region is formed at the junction where the STI structure and the n-well meet. A conventional load resistor of this type exhibits a parasitic capacitance value that is proportional to the sum of the oxide thickness, the depth of the STI structure, and the depth of the depletion region within the n-well.

In contrast to the conventional resistor of the first type, a second type of conventional load resistor includes a p-well formed below the STI structure. A deep p-well is formed below the p-well and is actively driven to a fixed biased voltage. A depletion region is formed at the junction where the STI structure and the p-well meet. A load resistor of this type exhibits a parasitic capacitance value that is proportional to the sum of the oxide thickness, the depth of the STI structure, and the depth of the depletion region within the p-well.

The first and second types of conventional load resistors may exhibit unacceptably large parasitic capacitance values unsuitable for use in high speed analog circuit designs. In an effort to develop resistors with reduced parasitic capacitance, a third type of load resistor has been developed in which the STI structure is formed in a native (with dopant concentration levels that are less than $10^{16}$ atoms/cm$^3$) semiconductor substrate. The STI structure is formed in neither an n-well nor a p-well. The parasitic capacitance associated with such type of load resistor is substantially lower than that associated with the first and second types of conventional resistors. Integrated circuits that include the third type of load resistors, however, may be unacceptably susceptible to noise, because the substrate is not actively tied to any bias level and may therefore vary sporadically during normal device operation.

SUMMARY

Integrated circuits may include resistor circuitry. An integrated circuit resistor may have a first terminal and a second terminal that can be coupled to transistors, capacitors, inductors, power supply lines, and other integrated circuit structures. The resistor may include a conductive structure (e.g., a polysilicon structure) that is disposed over a semiconductor substrate. The conductive structure may have a first portion that is connected to the first terminal of the resistor and may have a second portion that is connected to the second terminal of the resistor. The semiconductor substrate may be a p-type silicon substrate (as an example).

An oxide layer may be formed between the conductive structure and the surface of the substrate. A shallow trench isolation structure may be formed in the surface of the substrate directly beneath the oxide layer associated with the resistor. The resistor may include a deep n-well that is formed deep within the substrate below the shallow trench isolation structure. The resistor may include an n-well that extends from the top surface of the substrate to deep within the substrate to make contact with the deep n-well. This surrounding n-well and the deep n-well may collectively form a region that contains the shallow trench isolation structure.

This region within which shallow trench isolation structure is formed may exhibit relatively low dopant concentration levels with dopant concentration levels no greater than 10^15 dopant atoms/cm$^3$. This region is therefore neither an n-well (i.e., an n-type doped well that is traditionally associated with p-channel transistors) nor a p-well (i.e., a p-type doped well that is traditionally associated with n-channel transistors). The surrounding n-well and the deep n-well may serve to electrically isolate this resistor region from the rest of the substrate.

N-well tap regions may be formed within the surrounding resistor n-wells. The n-well tap regions may serve as contact points for biasing the n-wells (e.g., the surrounding n-wells and the deep n-well). The n-wells associated with the resistor may be reverse biased by supplying the n-well taps with positive voltage levels. Driving the resistor n-wells to elevated power supply voltage levels may help to fully deplete the region that is surrounded by the n-wells, thereby minimizing parasitic capacitance that is associated with the resistor.

Further features of the present invention, its nature and various advantages will be more apparent from the accompanying drawings and the following detailed description.

DETAILED DESCRIPTION

Embodiments of the present invention relate to integrated circuits with resistors. The integrated circuits may be digital signal processors, microprocessors, application specific integrated circuits (ASICs), programmable logic device integrated circuits (PLDs), or other types of integrated circuits.

Figure 1:
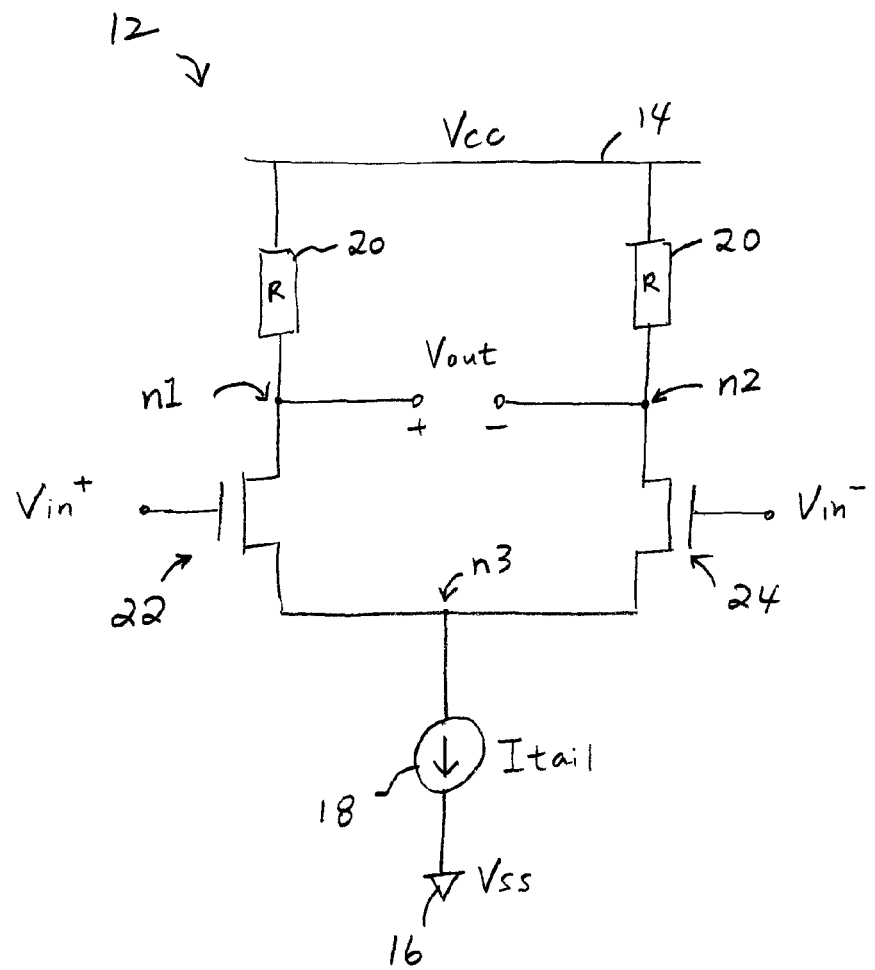
FIG. 1 is a diagram of an illustrative differential amplifier in accordance with an embodiment of the present invention.

Integrated circuits may include circuitry such as analog circuitry, digital circuitry, input-output circuitry, and other control circuitry for controlling the operation of the analog and digital circuitry. Analog circuitry on an integrated circuit typically includes amplifier circuits for amplifying alternating current (AC) signals (sometimes referred to as "small" signals). FIG. 1 is a circuit diagram of an exemplary amplifier circuit such as differential amplifier 12. As shown in FIG. 1, amplifier 12 may include a first input transistor 22, a second input transistor 24, first and second load resistors 20, and a current source 18 that are coupled between a positive power supply line 14 (e.g., a power supply line on which positive power supply voltage Vcc is provided) and a ground power supply line 16 (e.g., a power supply line on which ground power supply voltage Vss is provided).

First input transistor 22 and first resistor 20 may be coupled in series between power supply line 14 and a tail node n3. Second input transistor 24 and second resistor 20 may be coupled in series between power supply line 14 and tail node n3. Current source 18 may be coupled between tail node n3 and ground line 16. Current source 18 may therefore sometimes be referred to as a tail current source carrying current Itail.

First input transistor 22 may have a gate configured to receive positive input signal Vin$^+$, whereas second input transistor 24 may have a gate configured to receive negative input signal Vin$^-$. Input signals Vin$^+$ and Vin$^-$ serve collectively as a differential input signal for amplifier 12. The node at which transistor 22 and first resistor 20 are connected may serve as a first output terminal n1 of amplifier 12. The node at which transistor 24 and second resistor 20 are connected may serve as a second output terminal n2 of amplifier 12. Output terminals n1 and n2 may serve collectively as a differential output port at which differential amplifier output signal Vout is provided. First and second resistors 20 that are coupled to amplifier output terminals n1 and n2 in this way may therefore sometimes be referred to as output resistors, output loads, resistive loads, load resistors, etc.

Figure 2:
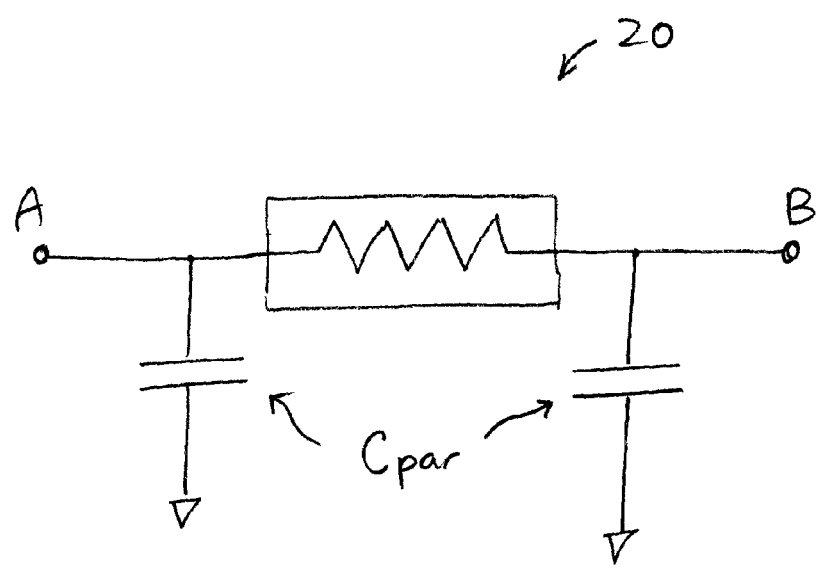
FIG. 2 is a diagram showing parasitic capacitance associated with an illustrative integrated circuit resistor in accordance with an embodiment of the present invention.

Resistor 20 may have associated parasitic capacitance (see, e.g., FIG. 2). Resistor 20 may have a first terminal A and a second terminal B. As shown in FIG. 2, there may be parasitic capacitance Cpar that is present at each of terminals A and B of resistor 20. Ideally, an integrated circuit resistor exhibits zero parasitic capacitance. However, due to the method with which on-chip resistors are manufactured on a semiconductor substrate, at least some amount of parasitic capacitance will be present.

Parasitic capacitance Cpar that is associated with resistor 20 may degrade the performance of amplifier 12, because Cpar effectively loads amplifier output terminals n1 and n2 with additional capacitance. For example, having a larger capacitance at the output of an amplifier may decrease the bandwidth of the amplifier. In order to increase the bandwidth of the amplifier, gain will have to be sacrificed (e.g., gain-bandwidth product for an amplifier with fixed dimensions is fixed). In general, it is desirable to form amplifier exhibiting high bandwidth when being used in high performance analog circuit design. In such applications, it may therefore be desirable to reduce the amount of parasitic capacitance Cpar associated with resistors 20 for optimizing amplifier performance.

Improving amplifier performance is merely one example illustrating the benefit of having resistors with reduced Cpar. In practice, providing resistors with low Cpar may be beneficial for use in data converters, comparators, buffers, voltage regulators, and other suitable analog and digital circuitry.

Figure 3:
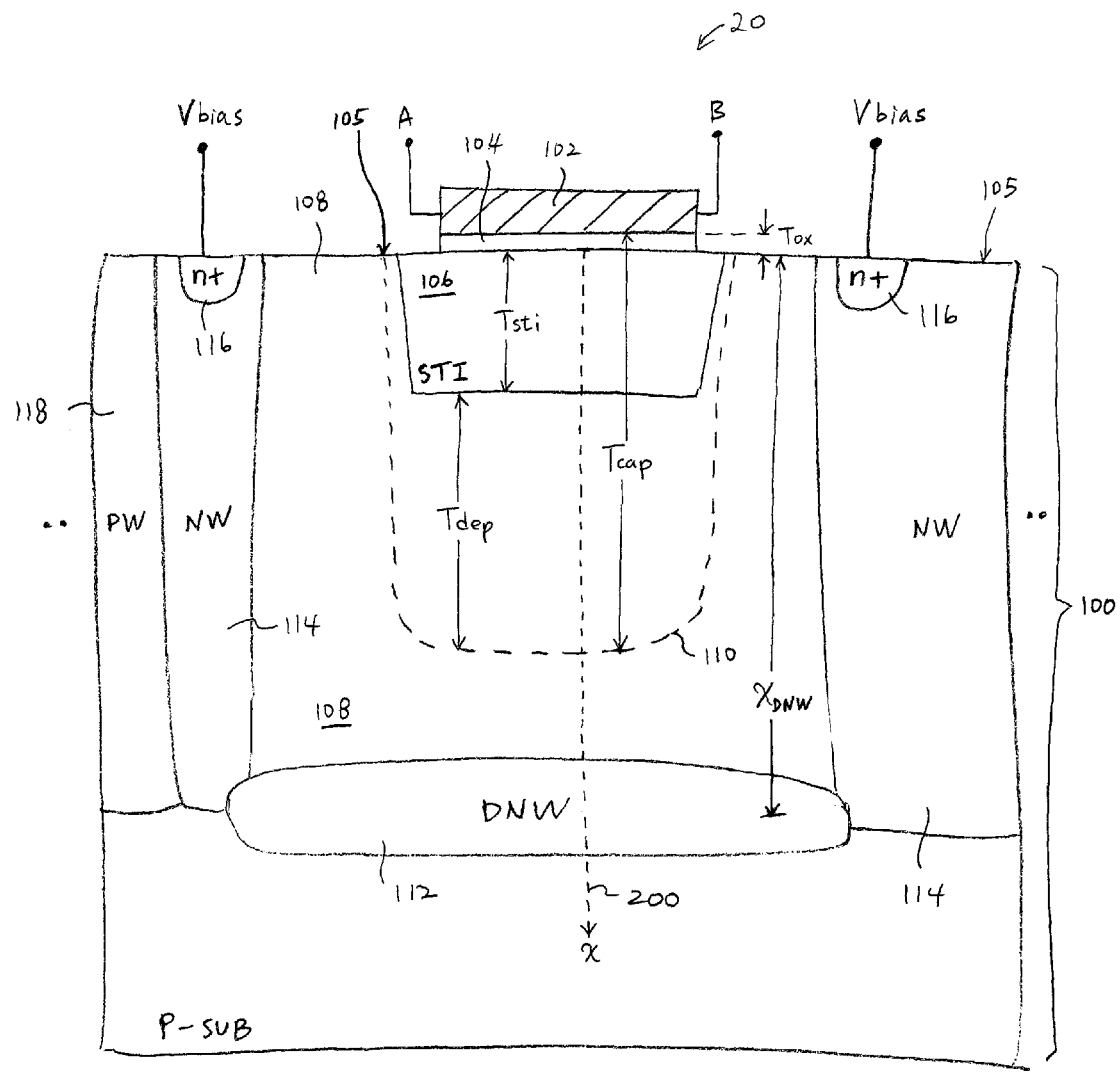
FIG. 3 is a cross-sectional side view of an illustrative resistor formed in a semiconductor substrate in accordance with an embodiment of the present invention.

FIG. 3 is a cross-sectional side view of integrated circuit resistor 20 formed in a semiconductor substrate 100. Substrate 100 may be a p-type silicon substrate. For example, substrate 100 may be lightly doped using p-type dopants (e.g., boron) with dopant concentrations of no more than $10^{14}$ dopant atoms/cm$^3$. Regions of substrate 100 with such low dopant concentrations may be referred to as "native" or substantially undoped substrate regions.

As shown in FIG. 3, resistor 20 may include a conductive structure 102 disposed over a top surface 105 of substrate 100. Structure 102 may be formed using polysilicon, metal, or other suitable conductive structures. Structure 102 (sometimes referred to as a gate structure) may have a first terminal portion that is connected to terminal A of resistor 20 and a second terminal portion that is connected to terminal B of resistor 20. A dielectric layer such as layer 104 may be interposed between structure 102 and surface 105 of substrate 100. Dielectric layer 104 may be formed using silicon oxide, hafnium oxide, or other suitable insulating material and may therefore sometimes be referred to as an oxide layer (or gate oxide liner). Oxide layer 104 may have a thickness that is denoted by Tox.

A shallow trench isolation (STI) structure 106 may be formed in substrate 100 directly below structure 102 such that oxide liner is interposed between STI structure 106 and conductive structure 102. STI structure 106 may be formed from silicon dioxide (as an example) or other suitable dielectric material. STI structures are typically formed on an integrated circuit for providing physical separation and/or electrical isolation between two adjacent transistors. STI structure 106 that is formed as a part of resistor 20 may serve to separate conductor 102 from native substrate material that is present directly beneath structure 106. STI structure 106 may have a thickness extending to a depth Tsti below surface 105 of substrate 100.

A deep n-well (DNW) such as deep n-well 112 may be formed even further in substrate 100 below STI structure 106. Deep n-well 112 may be formed using deep implant techniques. For example, n-type dopants (e.g., phosphorous, arsenic, etc.) may be implanted deep within substrate 100 to form deep n-well region 112 with concentrations of up to $10^{17}$ dopant atoms/cm$^3$ (as an example).

Resistor 20 may have a footprint that is defined by the size of associated resistor STI structure 106 (when viewed from the top of the integrated circuit). Surrounding n-well such as n-well 114 may be formed in substrate 100 outside of and surrounding the footprint of resistor 20. N-well 114 may form electrical contact with deep n-well 112 (because both wells 112 and 114 are of the same doping type). A well tap region such as n+ tap region 116 may be formed within n-well 114. N+ tap region 116 may have a relatively high dopant concentration of up to $10^{19}$ atoms/cm$^3$. Tap region 116 may serve as a well bias terminal for resistor 20 (e.g., tap region 116 may receive well biasing voltage Vbias). Other regions that are not part of resistor 20 may include p-wells 118 or n-wells formed in substrate 100 (as an example).

STI structure 106 may be formed in a region such as region 108 that is surrounded by associated n-well 114 and deep n-well 112 (e.g., n-well 114 and deep n-well 112 associated with a particular resistor collectively serve to electrically isolated region 108 from the rest of substrate 100). N-well structures 112 and 114 that are doped with n-type dopants and native regions in substrate 100 that are doped with p-type dopants are said to exhibit opposite doping types. Region 108 is considered as neither a p-well nor an n-well, because no separate fabrication step is used for exclusively doping region 108. Region 108 may be composed of substantially native substrate (i.e., the majority of region 108 may exhibit p-type dopant concentrations of no more than $10^{14}$ dopant atoms/cm$^3$).

Figure 4:
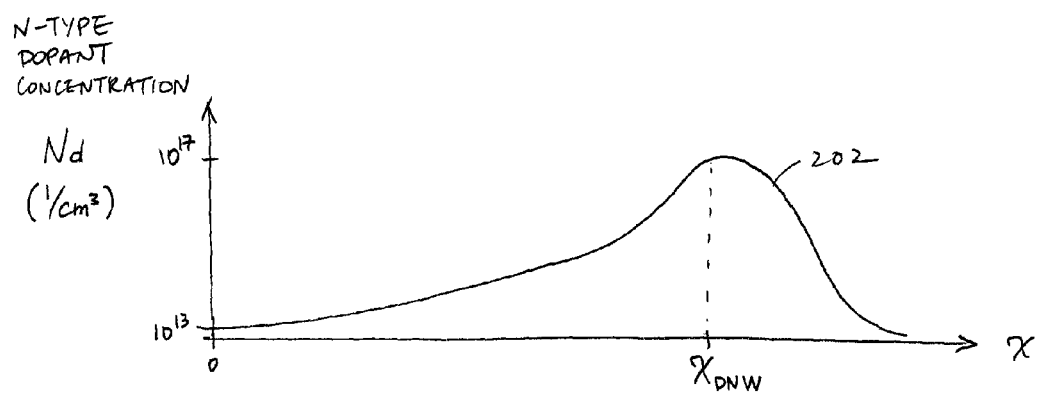
FIG. 4 is a graph plotting dopant concentration versus distance from a top surface of a semiconductor substrate in accordance with an embodiment of the present invention.

In practice, region 108 may be counter-doped during formation of deep n-well 112 (i.e., p-type native substrate region 108 may be counter-doped with n-type dopants). FIG. 4 shows the n-type dopant concentration profile as a function of depth X as measured from the top of surface 105 (see, e.g., dotted line 200 of FIG. 3). As shown in FIG. 4, dopant concentration profile curve 202 exhibits a peak at depth $X_{DNW}$ corresponding to the location of deep n-well 112 within substrate 100. Curve 202 may decrease exponentially when deviating from $X_{DNW}$. As a result, region 108 may have a p-- (native) dopant concentration near the interface between region 108 and STI structure 106 (e.g., may have a low p-type dopant concentration of $10^{14}$ dopant atoms/cm$^3$) and may have an n--dopant concentration near the interface between region 108 and deep n-well 112 (e.g., may have a low n-type dopant concentration of $10^{14}$ dopant atoms/cm$^3$). In other words, the dopant concentration level of region 108 may be substantially equal to the dopant concentration level of native substrate 100 located below deep n-well 112.

During normal operation, terminals A and B of resistor 20 may receive positive voltage signals. As result, a depletion region such as depletion region 110 may be formed at the junction where STI structure 106 and region 108 meet (see, FIG. 3). Depletion region 110 may have a depth Tdep that extends from the bottom of STI structure 106. Depth Tdep may be dependent on the dopant concentration of region 108. In general, a more highly doped region will result in a smaller depletion region.

For example, consider a first scenario in which region 108 of resistor 20 is an n-well (i.e., a well having an n-type dopant concentration of $10^{18}$ dopant atoms/cm$^3$). Consider a second scenario in which region 108 of resistor 20 is a native p-type substrate (i.e., a region having an almost intrinsic p-type dopant concentration of $10^{13}$ dopant atoms/cm$^3$). The depletion region associated with region 108 in the first scenario will exhibit a Tdep that is substantially smaller than the Tdep of the depletion region associated with region 108 in the second scenario.

The parasitic capacitance Cpar of resistor 20 may depend on the sum of Tox, Tsti, and Tdep (as denoted by Tcap in FIG. 3). In general, capacitance Cpar may be inversely proportion to Tcap. It may therefore be desirable to maximize Tox, Tsti, and Tdep in an effort to reduce Cpar associated with resistor 20. Integrated circuits are often formed with gate oxides of different thicknesses (i.e., integrated circuits often include at least a thick gate oxide for use with input-output circuitry and a thin gate oxide for use with high-speed circuitry). Gate oxide 104 may therefore be formed using thick gate oxide. Thickness Tsti of STI structure 106 may be dependent on the current integrated circuit manufacturing technology and may be relatively inflexible.

Depletion region depth Tdep can be adjusted to reduce Cpar. As mentioned above, regions with low dopant concentrations generally exhibit larger depletion widths. It is therefore desirable to provide region 108 with minimal n-type or p-type doping for optimal Cpar reduction.

Figure 5:
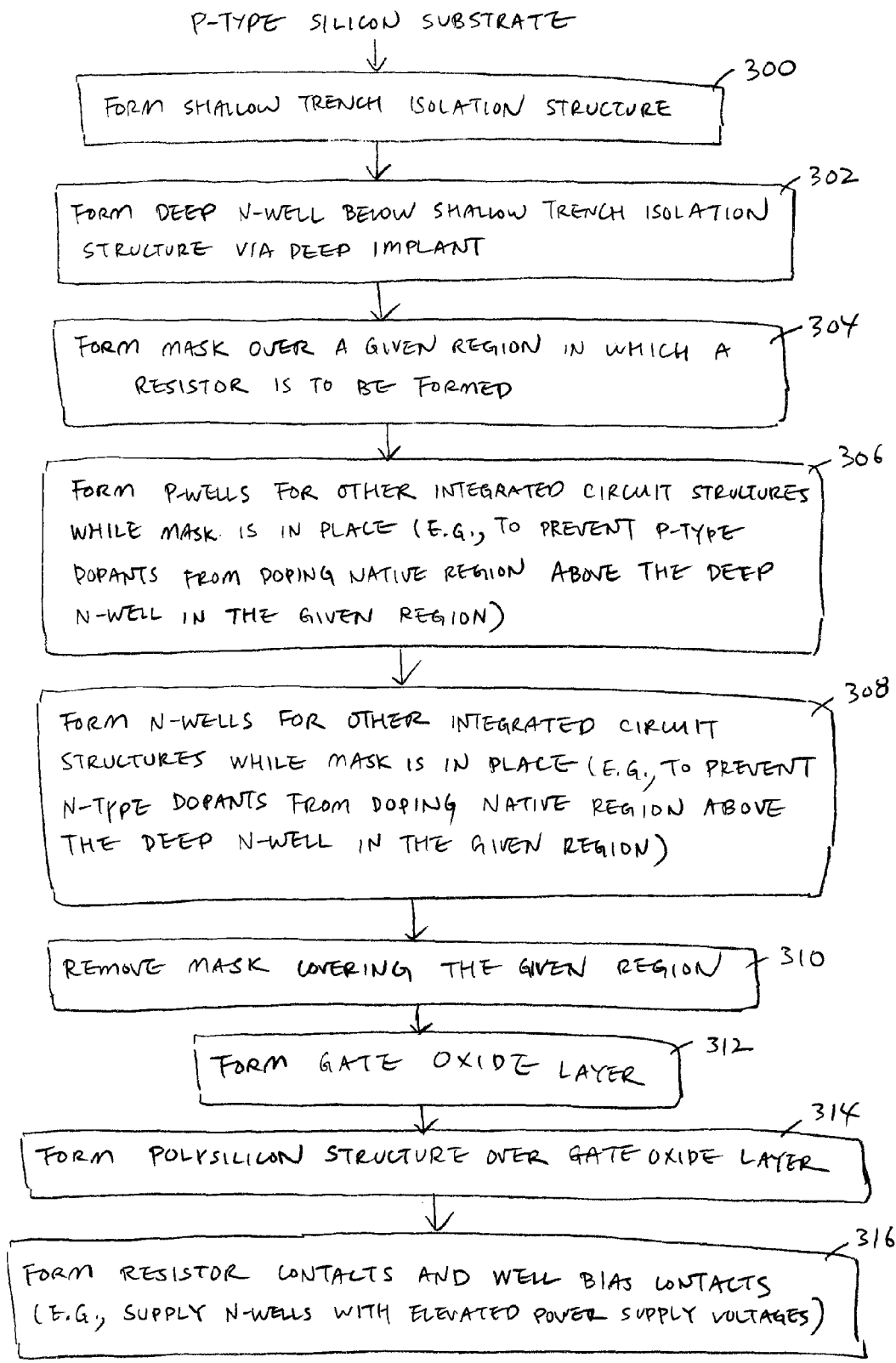
FIGS. 5 and 6 are flow charts of illustrative steps for forming the resistor of the type shown in FIG. 3 in accordance with an embodiment of the present invention.

FIG. 5 is a flow chart of illustrative steps involved in forming resistor 20 of the type described in connection with FIG. 3. At step 300, shallow trench isolation structure 106 may be formed in p-type silicon substrate 100. At step 302, deep n-well may be formed below the shallow trench isolation structure 106 via deep implant.

At step 304, a mask may be selectively formed over a given region (e.g., a region having the same size as region 108) in which resistor 20 is to be formed. The mask may at least cover the footprint of resistor 20. At step 306, p-wells may be formed for other integrated circuit structures while the mask is in place (e.g., p-wells may be formed for n-channel transistors). The mask may prevent the p-type dopants from doping region 108 in the given region. At step 308, n-wells may be formed for other integrated circuit structures (e.g., n-wells may be formed for p-channel transistors and may be formed to make electrical contact with deep n-well 112). The mask may prevent the n-type dopants from doping region 108 in the given region.

At step 310, the mask may be removed from the given region. At step 312, gate oxide layer 104 may be formed on top of STI structure 106 (e.g., via deposition techniques such as atomic layer deposition (ALD), molecular beam epitaxy (MBE), electrochemical deposition (ECD), chemical vapor deposition (CVD), physical vapor deposition (PVD), or other types of liner deposition techniques).

At step 314, conductive structure 102 (e.g., a polysilicon structure) may be formed over layer 104. At step 316, resistor contacts and well bias contacts may be formed. In particular, metal contacts may be formed to contact structure 102 to serve as terminals A and B for resistor 201. Contacts may also be formed so make electrical contact with n-well 114 and deep n-well 112 so that n-wells 112 and 114 may be driven to appropriate bias levels during normal operation of resistor 20.

One way of further increasing Tdep is to reverse bias n-wells 112 and 114. N-wells 112 and 114 may be reverse biased by raising Vbias to a positive voltage level. If Vbias is raised to a sufficiently high voltage level, region 108 may be substantially depleted of mobile carriers (e.g., region 108 can be fully depleted by sufficiently elevating Vbias above a predetermined threshold). When region 108 is fully depleted, the edge of depletion region 110 is limited by the depth of deep n-well 112.

Figure 7:
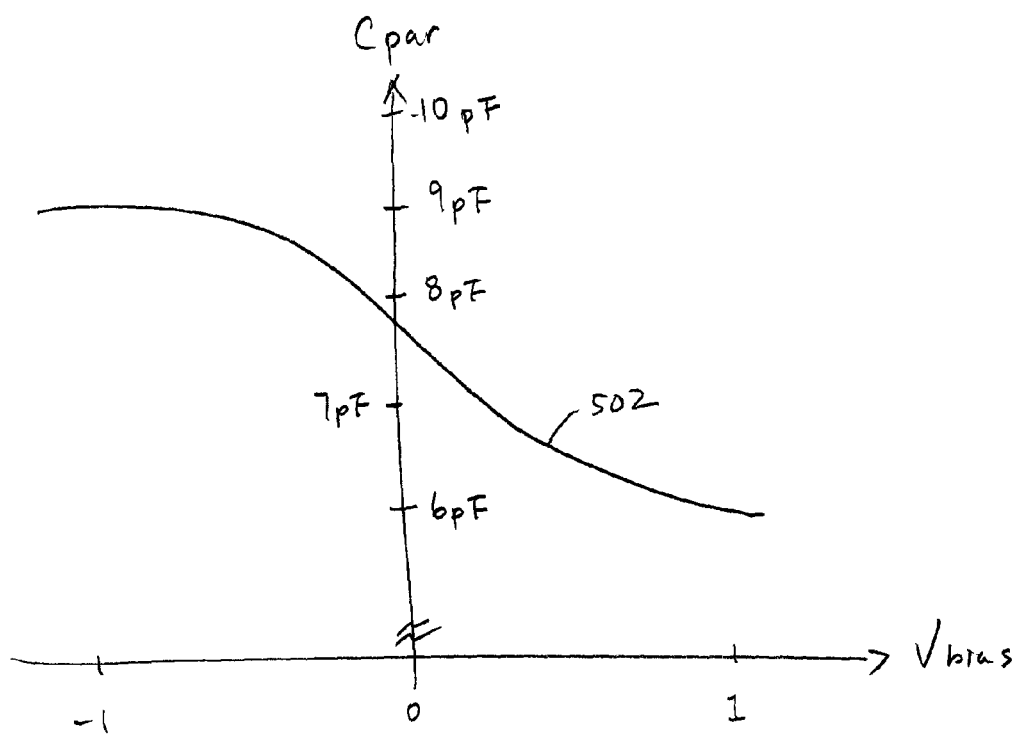
FIG. 7 is a plot of parasitic resistance versus well bias voltage in accordance with an embodiment of the present invention.

FIG. 7 plots resistor parasitic capacitance Cpar versus well bias voltage Vbias. As shown by curve 502 in FIG. 7, higher (more positive) Vbias levels result in lower Cpar levels while lower (more negative) Vbias levels result in higher Cpar levels. It may therefore be desirable to reverse the n-well regions associates with resistor 20 by driving Vbias to elevated power supply voltage levels (e.g., so that region 108 is fully depleted).

Figure 6:
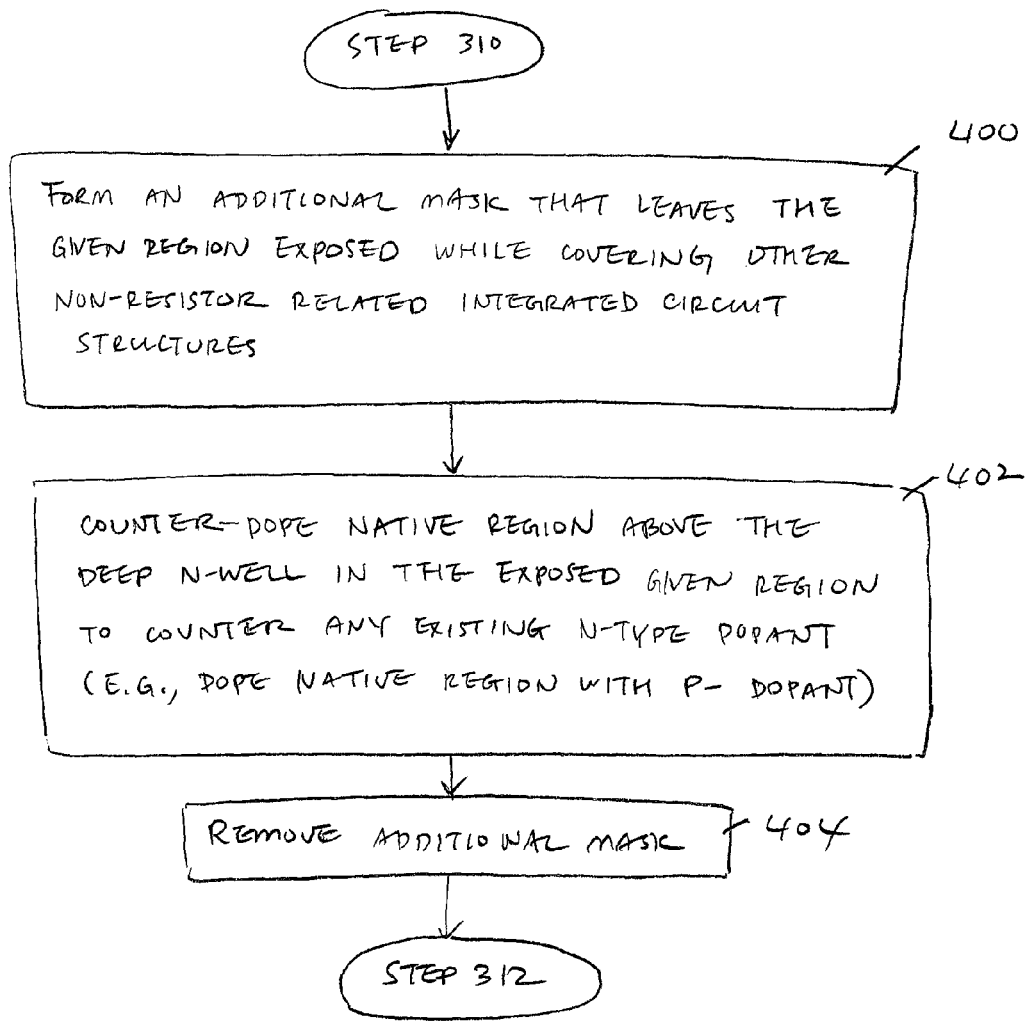

If desired, region 108 may be further counter-doped to mitigate the effect of n-type doping due to the deep n-well implant. FIG. 6 shows additional steps that may be performed between steps 310 and 312 of FIG. 5. Following step 310, an additional mask may be formed that leaves the resistor region exposed while covering the other integrated circuit structures (step 400). At step 402, region 108 may be counter-doped with p− dopants (i.e., with a low dose of p-type dopes) such that the portion of region 108 adjacent to deep n-well 112 exhibits near intrinsic or native substrate doping concentration levels. At step 404, the additional mask may be removed and processing may proceed to step 312 (of FIG. 5).

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit resistor comprising:
    a substrate having a first dopant concentration level;
    a resistor structure disposed over a region in the substrate, wherein the region has a second dopant concentration level that is substantially equal to the first dopant concentration level;
    a plurality of well structures in the substrate that surrounds the region, wherein the plurality of well structures and at least a portion of the region have opposite doping types; and
    dielectric material interposed between the resistor structure and the substrate.

2. The integrated circuit resistor defined in claim 1, wherein the substrate comprises a p-type semiconductor substrate.

3. The integrated circuit resistor defined in claim 1, wherein the substrate comprises a surface over which the resistor structure is disposed, the resistor further comprising:
    a shallow trench isolation structure formed within the region of the substrate under the resistor structure, wherein the shallow trench isolation structure is formed in the surface of the substrate.

4. The integrated circuit resistor defined in claim 3, wherein the dielectric material is interposed between the resistor structure and the shallow trench isolation structure.

5. The integrated circuit resistor defined in claim 1, wherein the plurality of well structures comprises n-wells.

6. The integrated circuit resistor defined in claim 3, wherein the plurality of well structures includes a first n-well formed below the shallow trench isolation structure, and wherein the first n-well comprises a deep n-well.

7. The integrated circuit resistor defined in claim 6, wherein the plurality of well structures further includes a second n-well that extends from the surface of the substrate down into the substrate to make electrical contact with the first n-well.

8. The integrated circuit resistor defined in claim 7, wherein the plurality of well structures comprises reversed-biased n-well regions.

9. Integrated circuit resistor circuitry comprising:
    a substrate;
    a conductive structure disposed over a region in the substrate, wherein the conductive structure has portions forming first and second terminals for the integrated circuit resistor circuitry; and
    a plurality of well structures in the region that surrounds the region, wherein the region is fully depleted of mobile carriers.

10. The integrated circuit resistor circuitry defined in claim 9, wherein the region and the plurality of well structures have opposite doping types.

11. The integrated circuit resistor circuitry defined in claim 10, wherein the region has a first dopant concentration level, and wherein the plurality of well structures has a second dopant concentration level that is substantially greater than the first dopant concentration level.

12. The integrated circuit resistor circuitry defined in claim 9 further comprising:
    a first power supply line on which a first power supply voltage is provided; and
    a second power supply line on which a second power supply voltage that is less than the first power supply voltage is provided, wherein the integrated circuit resistor circuitry is coupled between the first and second power supply lines, and wherein the n-well structures are biased using a voltage that is greater than the second power supply voltage.

13. The integrated circuit resistor circuitry defined in claim 9 further comprising:
    a shallow trench isolation structure that is formed in the fully depleted region under the conductive structure.

14. The integrated circuit resistor circuitry defined in claim 13 further comprising:
    a dielectric liner interposed between the conductive structure and the shallow trench isolation structure.

15. The integrated circuit resistor circuitry defined in claim 1, wherein the resistor structure comprises an undoped conductive structure.

16. Integrated circuit resistor circuitry comprising:
    a substrate having a surface and a first dopant concentration level;
    a resistor structure disposed over a region in the substrate, wherein the region has a second dopant concentration level that is substantially equal to the first dopant concentration level and wherein the resistor structure is formed from material selected from the group consisting of metal and polysilicon;
    a plurality of well structures in the substrate that surrounds the region, wherein the plurality of well structures and at least a portion of the region have opposite doping types; and
    a shallow trench isolation structure formed under the surface of the substrate, wherein the shallow trench isolation is interposed between the resistor structure and the region.

* * * * *